(12) United States Patent
Chang et al.

(10) Patent No.: US 9,960,151 B2
(45) Date of Patent: May 1, 2018

(54) SEMICONDUCTOR DEVICE, DISPLAY PANEL ASSEMBLY, SEMICONDUCTOR STRUCTURE

(71) Applicant: Novatek Microelectronics Corp., Hsinchu (TW)

(72) Inventors: Chieh-Hsiang Chang, Miaoli County (TW); Wen-Ching Huang, Hsinchu (TW); Kuo-Yuan Lu, Hsinchu (TW); Huang-Chin Tang, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days. days.

(21) Appl. No.: 15/226,905

(22) Filed: Aug. 2, 2016

(65) Prior Publication Data

US 2018/0040596 A1     Feb. 8, 2018

(51) Int. Cl.
*G02F 1/1345*     (2006.01)
*H01L 25/16*      (2006.01)
(Continued)

(52) U.S. Cl.
CPC .......... *H01L 25/167* (2013.01); *H01L 23/373* (2013.01); *H01L 23/4985* (2013.01); *H01L 23/49838* (2013.01); *H01L 23/552* (2013.01); *H01L 23/562* (2013.01); *H01L 24/14* (2013.01); *H01L 24/16* (2013.01); *H01L 2224/1403* (2013.01); *H01L 2224/16165* (2013.01)

(58) Field of Classification Search
CPC ....... H01L 24/14; H01L 24/16; H01L 25/167; H01L 23/4985; H01L 23/373; H01L 23/562

USPC ............................ 257/40; 345/173; 349/151
See application file for complete search history.

(56) References Cited

U.S. PATENT DOCUMENTS 6,023,094 A * 2/2000 Kao ........................ H01L 21/56
257/632
6,678,028 B2 * 1/2004 Yamate ................. G02F 1/1345
257/737
(Continued)

FOREIGN PATENT DOCUMENTS

TW     200523610     7/2005
TW     200914916     4/2009
(Continued)

OTHER PUBLICATIONS

"Office Action of Taiwan Counterpart Application," dated Oct. 27, 2017, p. 1-p. 7, in which the listed references were cited.

*Primary Examiner* — David Vu
*Assistant Examiner* — Brandon Fox
(74) *Attorney, Agent, or Firm* — JCIPRNET

(57) ABSTRACT

A semiconductor device includes a chip, a plurality of first bumps, and a plurality of second bumps. The chip includes an active surface. The first bumps are disposed on the active surface along a first direction. The second bumps are disposed on the active surface along a second direction parallel to the first direction, wherein one of the second bumps is located between adjacent two of the first bumps, a closest distance from the second bumps to the fan-out region is smaller than a closest distance from the first bumps to the fan-out region, and a first width of one of the first bumps is larger than a second width of one of the second bumps.

16 Claims, 3 Drawing Sheets

(51) Int. Cl.
*H01L 23/498* (2006.01)
*H01L 23/00* (2006.01)
*H01L 23/552* (2006.01)
*H01L 23/373* (2006.01)

(56) References Cited

U.S. PATENT DOCUMENTS

| | | | |
|---|---|---|---|
| 7,187,008 B2 * | 3/2007 | Inoue | G09G 3/3266 257/88 |
| 7,450,393 B2 | 11/2008 | Hwang et al. | |
| 8,063,497 B2 | 11/2011 | Tang et al. | |
| 8,299,631 B2 * | 10/2012 | Horiguchi | H05K 1/111 257/778 |
| 8,841,781 B2 | 9/2014 | Tang et al. | |
| 2003/0151055 A1 * | 8/2003 | Tsuji | G02F 1/13452 257/81 |
| 2004/0165138 A1 * | 8/2004 | Hwang | G02F 1/13452 349/152 |
| 2005/0157244 A1 | 7/2005 | Hwang et al. | |
| 2008/0055291 A1 * | 3/2008 | Hwang | H05K 3/361 345/204 |
| 2008/0143949 A1 * | 6/2008 | Ino | G02F 1/133308 349/151 |
| 2009/0268147 A1 | 10/2009 | Tang et al. | |
| 2010/0085320 A1 * | 4/2010 | Kuwajima | G02F 1/13338 345/173 |
| 2011/0037059 A1 * | 2/2011 | Gyoda | H01L 27/3276 257/40 |
| 2012/0025372 A1 | 2/2012 | Tang et al. | |
| 2015/0325457 A1 * | 11/2015 | Kim | H01L 23/4985 438/5 |
| 2016/0242295 A1 * | 8/2016 | Kim | H05K 1/189 |

FOREIGN PATENT DOCUMENTS

| | | |
|---|---|---|
| TW | 200945520 | 11/2009 |
| TW | 201015178 | 4/2010 |
| TW | 201508883 | 3/2015 |

* cited by examiner

SEMICONDUCTOR DEVICE, DISPLAY PANEL ASSEMBLY, SEMICONDUCTOR STRUCTURE

BACKGROUND OF THE INVENTION

Field of the Invention

The present invention generally relates to a semiconductor device, a display panel assembly and a semiconductor structure. More particularly, the present invention relates to a semiconductor device, a display panel assembly using the same and a semiconductor structure.

Description of Related Art

Ever-advancing wafer fabrication technology has led to rapid development of integrated circuit (IC) industry. ICs fabricated are lighter in weight, smaller in size, more complex and versatile in functions and have higher pin count and higher frequency. chip-on-film (COF) package satisfies the packing requirements of the ICs fabricated in accordance with this development trend. The COF package can have a fine pitch and good flexibility, which has a good performance in size stability, line high density, flame resistance, and environment protection.

In general, the COF package is to weld/package the IC onto a flexible circuit film. A plurality of metal bumps are welded on the pads of the IC. However, when an arrangement of the metal bumps on the chip follows the trend of fine pitch, the shortened distance between the metal bumps may give rise to an overflow of the metal bumps during a reflow process, which is likely to cause circuit shortage. Moreover, during the applications of fine-pitch package, especially for high definition (extremely fine pitch) package, misalignment or alignment shifting often occurs, which seriously deteriorates the bonding ability of the bump. Also, the thickness of the chip is hard to be further reduced. Therefore, the industry is keen to see whether further solutions can be provided to increase the yield of fine-pitch package and reduce the thickness of the chip.

SUMMARY OF THE INVENTION

Accordingly, the present invention is directed to a semiconductor device, which improves yield of the semiconductor device.

The present invention is directed to a display panel assembly, which improves yield of the display panel assembly using the semiconductor device.

The present invention is directed to a semiconductor structure, which further reduces a thickness of the chip thereof.

The present invention provides a semiconductor device including a chip, a plurality of first bumps, and a plurality of second bumps. The chip includes an active surface. The first bumps are disposed on the active surface along a first direction. The second bumps are disposed on the active surface along a second direction parallel to the first direction, wherein one of the second bumps is located between adjacent two of the first bumps, and a first width of one of the first bumps is larger than a second width of one of the second bumps.

The present invention provides a display panel assembly including a display panel, a flexible circuit film, a chip, a plurality of first bumps and a plurality of second bumps. The display panel includes a pixel array located in a display region of the display panel, a plurality of pads disposed on a bonding region of the display panel and a plurality of connecting lines electrically connecting the pixel array and the pads. The flexible circuit film includes a fan-out region connecting the bonding region, a chip region and a plurality of traces extended from the chip region to the fan-out region and electrically connected to the connecting lines. The chip is disposed on the chip region and electrically connected to the traces, and the chip comprising an active surface. The first bumps are disposed on the active surface along a first direction. The second bumps are disposed on the active surface along a second direction parallel to the first direction, wherein a closest distance from the second bumps to the fan-out region is smaller than a closest distance from the first bumps to the fan-out region. Each of the traces connecting the first bumps passes through adjacent two of the second bumps to be extended to the fan-out region, and a width of one of the second bumps is smaller than a width of one of the first bumps.

The present invention further provides a semiconductor structure including a glass substrate, a carrier and a chip. The glass substrate includes a bonding region. The chip includes an active surface and a back surface opposite to each other, wherein the chip is disposed on the bonding region with the active surface. The carrier is disposed on the back surface of the chip.

According to an embodiment of the present invention, the chip is configured to be disposed on a flexible circuit film.

According to an embodiment of the present invention, the flexible circuit film comprises a fan-out region, a chip region and a plurality of traces extended from the chip region to the fan-out region, the chip is disposed on the chip region and the first bumps and the second bumps are electrically connected to the traces.

According to an embodiment of the present invention, a first portion of the traces connect the first bumps respectively, one of the first portion of the traces passes through adjacent two of the second bumps to be extended to the fan-out region.

According to an embodiment of the present invention, a carrier is disposed on a back surface of the chip and the back surface is opposite to the active surface.

According to an embodiment of the present invention, a thickness of the chip is equal to or smaller than 100 μm.

According to an embodiment of the present invention, the semiconductor device further includes a plurality of third bumps disposed on the active surface along a third direction parallel to the first direction, wherein one of the third bumps is located between adjacent two of the second bumps. A closest distance from the third bumps to the fan-out region is smaller than the closest distance from the second bumps to the fan-out region, and the first width of one of the first bumps is larger than a third width of one of the third bumps.

According to an embodiment of the present invention, the second width of one of the second bumps is equal to or larger than a third width of one of the third bumps.

According to an embodiment of the present invention, the semiconductor device further includes a flexible layer disposed on a back surface of the chip opposite to the active surface.

According to an embodiment of the present invention, the flexible circuit film further includes at least one cut-out opening, the fan-out region and the cut-out opening are located at two opposite sides of the chip region respectively.

According to an embodiment of the present invention, the flexible circuit film further includes an EMI shielding layer and/or a heat-dissipation layer.

According to an embodiment of the present invention, the connecting lines are divided into a plurality of groups, and the display panel further comprises a plurality of multiplexers (MUX). Each of the MUXs configured to selectively connect one of the connecting lines from one of the groups to the corresponding pad.

According to an embodiment of the present invention, a number of the connecting lines from each of the groups is 2, 3, 4, 6, 8 or 9.

According to an embodiment of the present invention, any adjacent two of the connecting lines belong to two different groups among the multiplexer groups respectively.

According to an embodiment of the present invention, the carrier includes a plurality of conductive via for electrically connecting the chip and the bonding region.

According to an embodiment of the present invention, a thickness of the semiconductor structure is equal to or smaller than 0.2 mm.

In light of the foregoing, in the present invention, the first bumps and the second bumps are disposed on the active surface of the chip, wherein a closest distance from the second bumps to the fan-out region of the flexible circuit film is smaller than a closest distance from the first bumps to the fan-out region. As such, each of the traces connecting the first bumps passes through adjacent two of the second bumps to be extended to the fan-out region. Therefore, the width of one of the first bumps is larger than the width of one of the second bumps, so the trace passing through any two adjacent second bumps can keep a desirable distance from the two adjacent second bumps to avoid misalignment or solder overflow. Therefore, the present invention can improve the yield of the semiconductor device and the display panel assembly using the same.

Moreover, a carrier may be disposed on a back surface of the chip. Thereby, with the support of the carrier, the chip can be ground even thinner without cracking or breaking due to external impact. Therefore, the present invention can further reduce the thickness of the chip and the overall thickness of the display panel assembly or the semiconductor structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
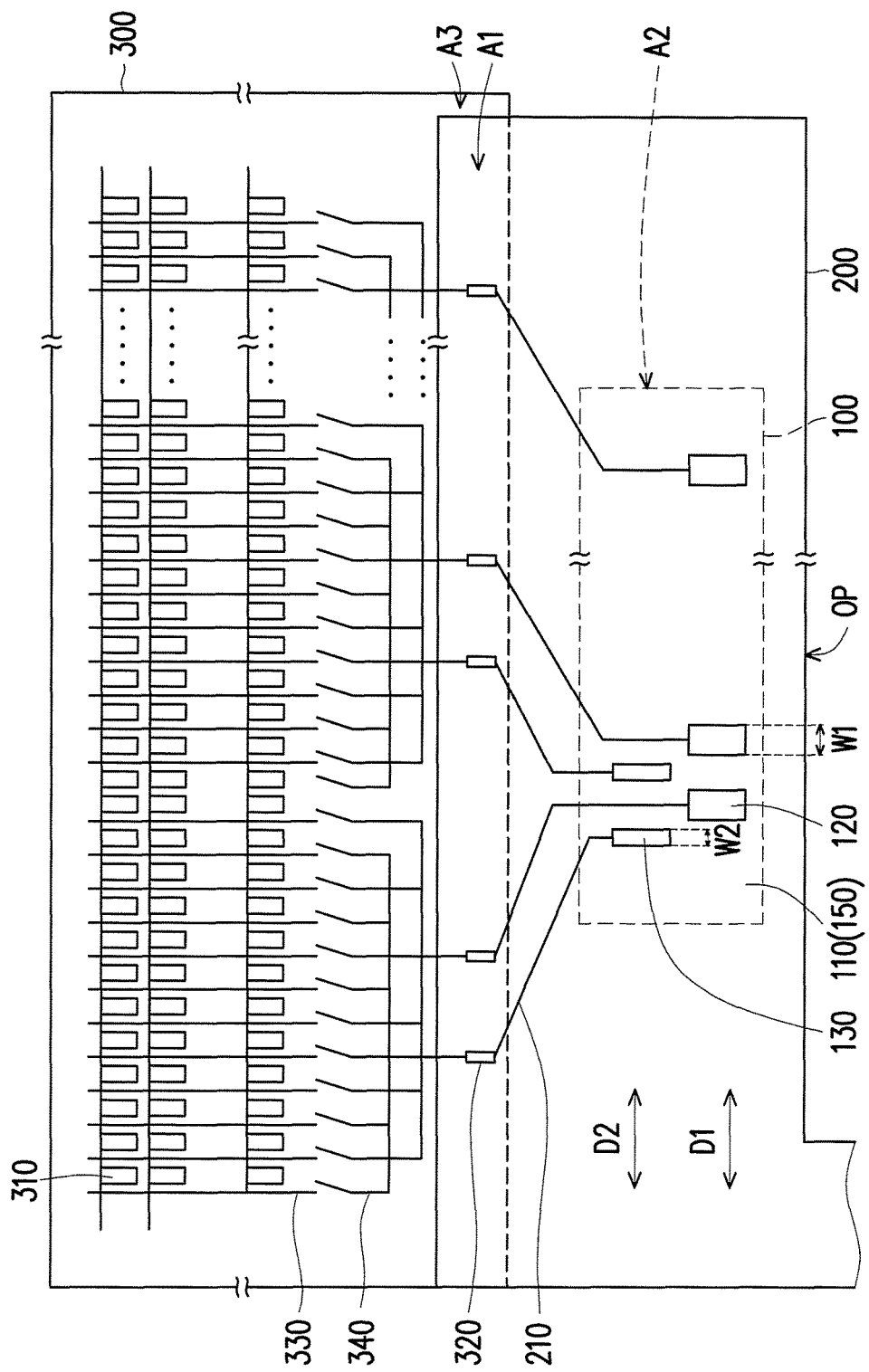
FIG. 1 illustrates a schematic view of a display panel assembly according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
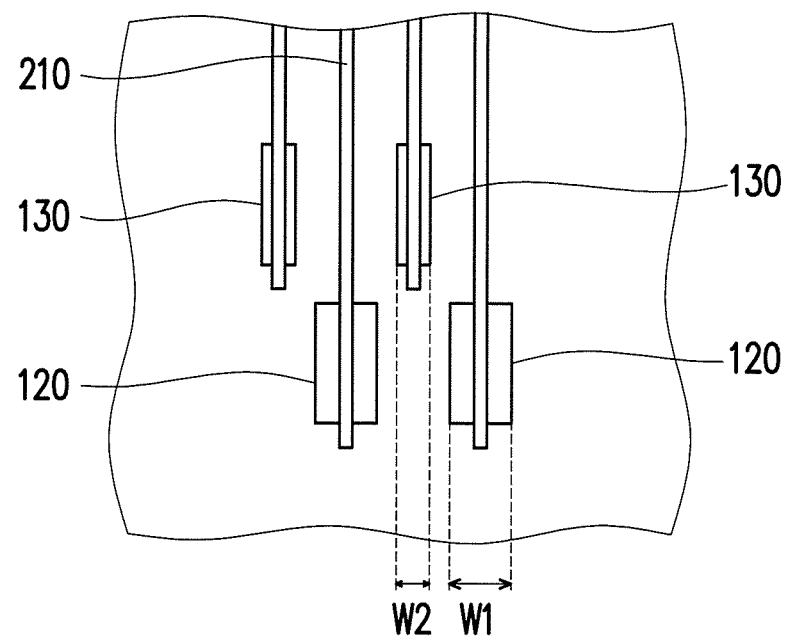
FIG. 2 illustrates a partial enlarged view of the arrangement of the first bumps, the second bumps and the traces in the display panel assembly in FIG. 1.
Figure 4:
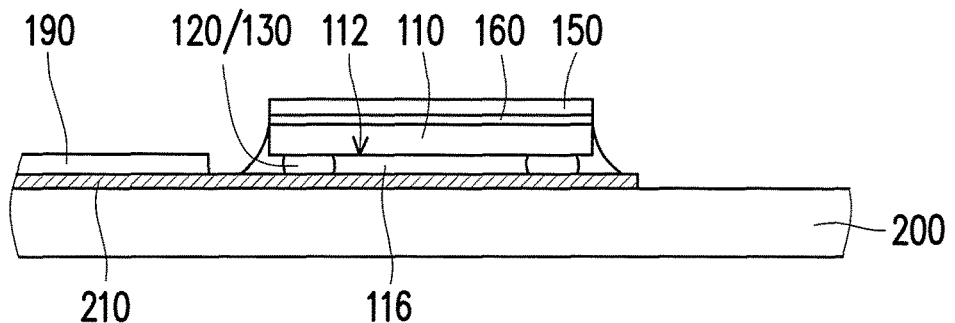
FIG. 4 illustrates a partial cross-sectional view of the display panel assembly in FIG. 1.

FIG. 1 illustrates a schematic view of a display panel assembly according to an embodiment of the invention. FIG. 2 illustrates a partial enlarged view of the arrangement of the first bumps, the second bumps and the traces in the display panel assembly in FIG. 1. FIG. 4 illustrates a partial cross-sectional view of the display panel assembly in FIG. 1. It is noted that the chip 110, the flexible circuit film 200 and the display panel 300 are depicted in a perspective manner in FIG. 1 in order to better illustrate the connecting relationship between the bumps 120, 130, the traces 210 and the pads 320. Referring to FIG. 1, FIG. 2 and FIG. 4 first, a semiconductor device 100 of the present embodiment may be a driver IC for the display panel assembly 100 shown in FIG. 1, but the invention is not limited thereto. The semiconductor device 100 includes a chip 110, a plurality of first bumps 120 and a plurality of second bumps 130. The chip 110 includes an active surface 112 shown in FIG. 4. The first bumps 120 are disposed on the active surface 112 along a first direction D1. The second bumps 130 are disposed on the active surface 112 along a second direction D2 parallel to the first direction D1, and one of the second bumps 130 is located between adjacent two of the first bumps 130. A first width W1 of one of the first bumps 120 is larger than a second width W2 of one of the second bumps 130.

In the present embodiment, the semiconductor device 100 can be applied to the display panel assembly 10 shown in FIG. 1, and the display panel assembly 10 includes the semiconductor device 100, a flexible circuit film 200 and a display panel 300. The flexible circuit film 200 includes a fan-out region A1, a chip region A2 and a plurality of traces 210. The traces 210 are extended from the chip region A2 to the fan-out region A1. The chip 110 is disposed on the chip region A2 of the flexible circuit film 200, and electrically connected to the traces 210 through the first bumps 120 and the second bumps 130. Namely, the semiconductor device 100 may be applied to a chip-on-film package. In the present embodiment, an underfill 116 may be filled in the gap between the chip 110 and the flexible circuit film 200 to further enhance the bonding strength of the chip 110, but the invention is not limited thereto.

Moreover, the display panel 300 includes a pixel array 310, a plurality of pads 320 and a plurality of connecting lines 330. The pixel array 310 are located in a display region of the display panel 300. The pads 320 are disposed on a bonding region A3 of the display panel 300 and the connecting lines 330 electrically connect the pixel array 310 and the pads 320. Accordingly, the fan-out region A1 of the flexible circuit film 200 may be connected to the bonding region A3 of the display panel 300. In the present embodiment, the fan-out region A1 of the flexible circuit film 200 may be overlapped with the bonding region A3 of the display panel 300, so the traces 210 are electrically connected to the connecting lines 330. The traces 210 are extended from the chip region A2 to the fan-out region A1 and electrically connected to the connecting lines 330, so the semiconductor device can be electrically connected to the display panel 300.

In detail, a closest distance from the second bumps 130 to the fan-out region A1 is smaller than a closest distance from the first bumps 120 to the fan-out region A1. Namely, the second bumps 130 are closer to the fan-out region A1 than the first bumps 120, and each of the traces 210 connecting the first bumps 120 passes through adjacent two of the second bumps 130, so that the traces 210 can be extended to the fan-out region A1. In other words, a first portion of the traces 210 connect the first bumps 120 respectively, and one of the first portion of the traces 210 passes through adjacent two of the second bumps 130, so that the traces 210 can be extended to the fan-out region A1. As such, the second width W2 of one of the second bumps 130 is smaller than the first width W1 of one of the first bumps 120, so the trace 210 passing through any two adjacent second bumps 130 can keep a desirable distance from the two adjacent second bumps 130 to avoid misalignment or solder overflow, so as to improve the yield of the semiconductor device 100 and the display panel assembly 10 using the semiconductor device 100.

In addition, the semiconductor device 100 may further include a flexible layer 160 as shown in FIG. 4. The flexible layer 160 may be disposed on a back surface of the chip 110 opposite to the active surface 112. In the present embodiment, the flexible layer 160 may be, for example, heat-dissipation paste or flexible gel, etc., so as to prevent the chip 110 from getting scratched or damaged. Moreover, the flexible circuit film 200 may further include at least one cut-out opening OP as shown in FIG. 1. The fan-out region A1 and the cut-out opening OP are located at two opposite sides of the chip region A2 respectively. The cut-out opening OP is configured to make space for other electronic components. The flexible circuit film 200 may further include an EMI shielding layer and/or a heat-dissipation layer 190 disposed on a top surface where the chip 110 is disposed or on a bottom surface opposite to the top surface where the chip 110 is disposed.

In the present embodiment, the connecting lines 330 may be divided into a plurality of groups, and the display panel 300 further includes a plurality of multiplexers 340 (MUX). The multiplexers are configured to select one of several analog or digital input signals and forwards the selected input into a single line. Therefore, each of the MUXs 340 is configured to selectively connect one of the connecting lines 330 from one of the groups to the corresponding pad 320. With such configuration, one pad 320 can correspond to multiple connecting lines 330, so as to reduce the number of the pads 320, which further reduce the number of the traces 210 and the bumps 120, 130. In the present embodiment, each of the MUXs 340 may be 2-MUX, 4-MUX, or 6-MUX, etc. Namely, a number of the connecting lines 330 from each of the groups is 2, 3, 4, 6, 8, 9, etc., which means each of the groups may include 2, 3, 4, 6, 8 or 9 of the connecting lines 330, but the number of the connecting lines 330 is not limited thereto. Any adjacent two of the connecting lines 330 belong to two different groups among the groups respectively, which means any two adjacent connecting lines 330 are connected to two different MUXs among the MUXs.

In the present embodiment, a carrier 150 is disposed on a back surface of the chip 110, wherein the back surface is opposite to the active surface 112. With the support of the carrier 150, the chip 110 can be ground even thinner without cracking or breaking due to external impact. In the present embodiment, a thickness of the chip 110 can be equal to or smaller than 100 μm, but, of course, the present invention is not limited thereto.

Figure 3:
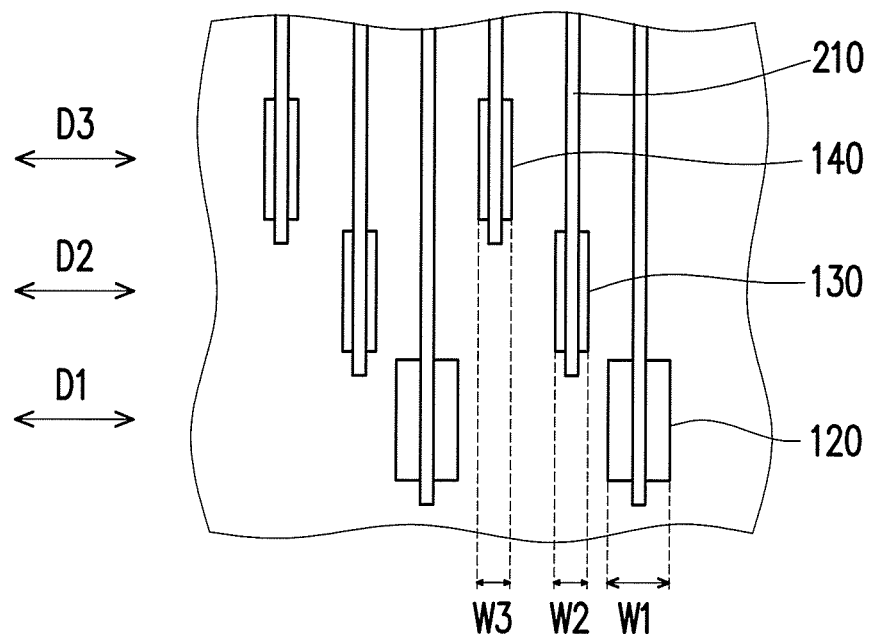
FIG. 3 illustrates a partial enlarge view of the arrangement of first bumps, second bumps, third bumps and traces in a display panel assembly according to an embodiment of the invention.

FIG. 3 illustrates a partial enlarge view of the arrangement of first bumps, second bumps, third bumps and traces in a display panel assembly according to an embodiment of the invention. It is noted that the embodiment in FIG. 3 contains many features same as or similar to the display panel assembly 10 disclosed earlier with FIG. 1 and FIG. 2. For purpose of clarity and simplicity, detail description of same or similar features may be omitted. The main differences between the embodiment in FIG. 3 and the previous embodiment in FIG. 2 are described hereinafter.

In the present embodiment, three rows of bumps 120, 130, 140 are illustrated, but, of course, the present invention does not limit the number of rows of the bumps. To be more specific, the semiconductor device of the embodiment further includes a plurality of third bumps 140 disposed on the active surface of the chip (as the active surface 112 of the chip 110 illustrated in FIG. 4) along a third direction D3 parallel to the first direction D1, and one of the third bumps 140 is located between adjacent two of the second bumps 130. A closest distance from the third bumps 140 to the fan-out region A1 (as the fan-out region A1 illustrated in FIG. 1) is smaller than the closest distance from the second bumps 130 to the fan-out region. Namely, the third bumps 140 are even closer to the fan-out region of the flexible circuit film than the second bumps 120. As such, the traces 210 connecting the first bumps 120 and the second bumps 130 pass through adjacent two of the third bumps 130, so that the traces 210 can be extended to the fan-out region A1. Accordingly, the first width W1 of one of the first bumps 120 is larger than a third width W3 of one of the third bumps 140, and the second width W2 of one of the second bumps 130 is equal to or larger than the third width W3 of one of the third bumps 140. Namely, the third width W3 is at least smaller than the first width W1, so the trace 210 passing through any two adjacent third bumps 140 can keep a desirable distance from the two adjacent third bumps 140 to avoid misalignment or solder overflow, so as to improve the yield of the semiconductor device and the display panel assembly using the same.

Figure 5:
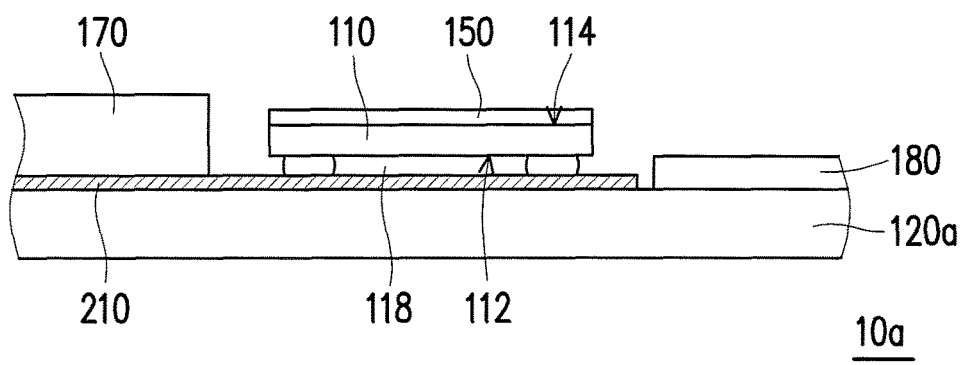
FIG. 5 illustrates a partial cross-sectional view of a semiconductor structure according to an embodiment of the invention.

FIG. 5 illustrates a partial cross-sectional view of a semiconductor structure according to an embodiment of the invention. It is noted that the embodiment in FIG. 5 contains many features same as or similar to the embodiment disclosed earlier with FIG. 4. For purpose of clarity and simplicity, detail description of same or similar features may be omitted. The main differences between the embodiment in FIG. 5 and the previous embodiment in FIG. 4 are described hereinafter.

In the present embodiment, the semiconductor structure 10a includes a glass substrate 120a, a carrier 150 and a chip 110. The semiconductor structure 10a may be a chip-on-glass package. The glass substrate 120a includes a bonding region. The chip 110 includes an active surface 112 and a back surface 114 opposite to each other as shown in 5, wherein the chip 110 is disposed on the bonding region of the glass substrate 120a with the active surface 112 and electrically connected to the bonding region. In the present embodiment, the chip 110 is mounted on the bonding region of the glass substrate 120a by an anisotropic conductive film (ACF) 118, but the invention is not limited thereto. The carrier 150 is disposed on the back surface 114 of the chip 110. Accordingly, with the support of the carrier 150, the chip 110 can be ground even thinner without cracking or breaking due to external impact, so as to further reduce the thickness of the chip 110 and the overall thickness of the semiconductor structure 10a. In the present embodiment, a thickness of the chip 110 can be equal to or smaller than 100 μm, and an overall thickness of the semiconductor structure 10a is equal to or smaller than 0.2 mm. The semiconductor structure 10a may be applied to a display panel assembly, so the glass substrate 120a may be the substrate of the display panel, and a cover glass 170 may cover the glass substrate 120a and expose the chip 110. Also, a flexible printed circuit board 180 may be connected to the glass substrate 120a for electrically connecting the display panel and the main board.

In sum, in the semiconductor device and the display panel assembly using the same of the invention, the first bumps and the second bumps are disposed on the active surface of the chip. A closest distance from the second bumps to the fan-out region of the flexible circuit film is smaller than a closest distance from the first bumps to the fan-out region. As such, each of the traces connecting the first bumps passes through adjacent two of the second bumps to be extended to the fan-out region. Therefore, the width of one of the first bumps is larger than the width of one of the second bumps, so the trace passing through any two adjacent second bumps can keep a desirable distance from the two adjacent second bumps to avoid misalignment or solder overflow. Therefore, the present invention can improve the yield of the semiconductor device and the display panel assembly using the same.

In addition, a carrier may be disposed on a back surface of the chip in chip-on film (COF) or chip-on-glass (COG) package. As such, with the support of the carrier, the chip can be ground even thinner without cracking or breaking due to external impact. Therefore, the present invention can further reduce the thickness of the chip and the overall thickness of the display panel assembly or the semiconductor structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
   a chip comprising an active surface, wherein the chip is configured to be disposed on a flexible circuit film, the flexible circuit film comprises a fan-out region, a chip region and at least one cut-out opening, and the fan-out region and the cut-out opening are located at two opposite sides of the chip region respectively;
   a plurality of first bumps disposed on the active surface along a first direction; and
   a plurality of second bumps, disposed on the active surface along a second direction parallel to the first direction, wherein one of the second bumps is located between adjacent two of the first bumps, and a first width of one of the first bumps is larger than a second width of one of the second bumps.

2. The semiconductor device as claimed in claim 1, wherein the flexible circuit film comprises a plurality of traces extended from the chip region to the fan-out region, the chip is disposed on the chip region and the first bumps and the second bumps are electrically connected to the traces.

3. The semiconductor device as claimed in claim 2, wherein a closest distance from the second bumps to the fan-out region is smaller than a closest distance from the first bumps to the fan-out region.

4. The semiconductor device as claimed in claim 2, wherein a first portion of the traces connect the first bumps respectively, one of the first portion of the traces passes through adjacent two of the second bumps to be extended to the fan-out region.

5. The semiconductor device as claimed in claim 1, wherein a carrier is disposed on a back surface of the chip, and the back surface is opposite to the active surface.

6. The semiconductor device as claimed in claim 5, wherein a thickness of the chip is equal to or smaller than 100 μm.

7. The semiconductor device as claimed in claim 1, further comprising a plurality of third bumps disposed on the active surface along a third direction parallel to the first direction, wherein one of the third bumps is located between adjacent two of the second bumps, and the first width of one of the first bumps is larger than a third width of one of the third bumps.

8. The semiconductor device as claimed in claim 7, wherein the second width of one of the second bumps is equal to or larger than a third width of one of the third bumps.

9. The semiconductor device as claimed in claim 1, further comprising a flexible layer disposed on a back surface of the chip opposite to the active surface.

10. The semiconductor device as claimed in claim 1, wherein the flexible circuit film further comprises an EMI shielding layer and/or a heat-dissipation layer.

11. A display panel assembly, comprising:
    a display panel comprising a pixel array located in a display region of the display panel, a plurality of pads disposed on a bonding region of the display panel and a plurality of connecting lines electrically connecting the pixel array and the pads, wherein the connecting lines are divided into a plurality of groups, the display panel further comprises a plurality of multiplexers (MUX), and each of the MUXs is configured to selectively connect one of the connecting lines from one of the groups to the corresponding pad; and
    a flexible circuit film comprising a fan-out region connecting the bonding region, a chip region and a plurality of traces extended from the chip region to the fan-out region and electrically connected to the connecting lines;
    a chip disposed on the chip region and electrically connected to the traces, and the chip comprising an active surface;
    a plurality of first bumps disposed on the active surface along a first direction; and
    a plurality of second bumps, disposed on the active surface along a second direction parallel to the first direction, wherein a closest distance from the second bumps to the fan-out region is smaller than a closest distance from the first bumps to the fan-out region, each of the traces connecting the first bumps passes through adjacent two of the second bumps to be extended to the fan-out region, and a second width of one of the second bumps is smaller than a first width of one of the first bumps.

12. The display panel assembly as claimed in claim 11, wherein a number of the connecting lines from each of the groups is 2, 3, 4, 6, 8 or 9.

13. The display panel assembly as claimed in claim 11, wherein any adjacent two of the connecting lines belong to two different groups among the groups respectively.

14. A semiconductor structure, comprising:
    a glass substrate comprises a bonding region;
    a chip comprises an active surface and a back surface opposite to each other, wherein the chip is disposed on the bonding region with the active surface; and
    a carrier disposed on the back surface of the chip, wherein the carrier includes a plurality of conductive via for electrically connecting the chip and the bonding region.

15. The semiconductor structure as claimed in claim 14, wherein a thickness of the chip is equal to or smaller than 100 μm.

16. The semiconductor structure as claimed in claim 14, wherein a thickness of the semiconductor structure is equal to or smaller than 0.2 mm.

\* \* \* \* \*